United States Patent
Wei

(10) Patent No.: US 9,638,925 B2
(45) Date of Patent: May 2, 2017

(54) DISPLAY APPARATUS

(71) Applicant: BOE TECHNOLOGY GROUP CO., LTD., Beijing (CN)

(72) Inventor: Wei Wei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/032,888

(22) PCT Filed: Dec. 5, 2014

(86) PCT No.: PCT/CN2014/093155
§ 371 (c)(1),
(2) Date: Apr. 28, 2016

(87) PCT Pub. No.: WO2016/004728
PCT Pub. Date: Jan. 14, 2016

(65) Prior Publication Data
US 2016/0246065 A1     Aug. 25, 2016

(30) Foreign Application Priority Data
Jul. 8, 2014     (CN) .......................... 2014 1 0323544

(51) Int. Cl.
*G02F 1/133*     (2006.01)
*G02B 27/22*     (2006.01)
(Continued)

(52) U.S. Cl.
CPC ..... *G02B 27/2214* (2013.01); *G02F 1/13306* (2013.01); *G02F 1/13439* (2013.01);
(Continued)

(58) Field of Classification Search
CPC . G02B 27/2214; H04N 13/0404; H04N 13/00
See application file for complete search history.

(56) References Cited

U.S. PATENT DOCUMENTS 7,916,223 B2 * 3/2011 Kitagawa .......... G02F 1/133504
349/15
2006/0001967 A1 1/2006 Techakumpuch et al.
(Continued)

FOREIGN PATENT DOCUMENTS

CN     1841127 A     10/2006
CN     101339310 A     1/2009
(Continued)

OTHER PUBLICATIONS

Chinese Office Action mailed Dec. 25, 2015.
Search Report and Written Opinion Mailed Mar. 24, 2015 from State Intellectual Property Office of the P.R. China.

*Primary Examiner* — Phu Vu
(74) *Attorney, Agent, or Firm* — Dilworth & Barrese, LLP; Michael J. Musella

(57) ABSTRACT

A display apparatus comprises a first panel (100) and a second panel (200) disposed in a spaced manner with the first panel (100). The first panel (100) comprises multiple first display groups and each first display group comprises multiple columns of sub pixels. The second panel (200) is a transparent panel and comprises multiple second display groups, and each second display group comprises multiple columns of sub pixels. Sub pixels in the first display groups are in a one-to-one correspondence with sub pixels in the second display groups. The display apparatus also comprises a multi-vision raster (300). The multi-vision raster can guide light sent by multiple columns of sub pixels in the first display groups on the first panel (100) to multiple columns of sub pixels of corresponding second display groups on the second panel (200) in a one-to-one correspondence manner, so that multiple vision fields are formed on a light emission surface of the second panel (200) and in each vision field, a three-dimensional image can be seen and the number of the vision fields is the same as the number of the columns of the (Continued)

sub pixels in the first display groups. When multiple users use the same display apparatus, the multiple users can see different three-dimension images in multiple different vision fields.

20 Claims, 1 Drawing Sheet

(51) Int. Cl.
    *G02F 1/1343*     (2006.01)
    *G09G 3/00*     (2006.01)
    *G09G 5/14*     (2006.01)
    *H01L 27/32*     (2006.01)
    *H01L 51/52*     (2006.01)
    *H04N 13/00*     (2006.01)

(52) U.S. Cl.
    CPC ....... *G02F 1/134309* (2013.01); *G09G 3/001* (2013.01); *G09G 3/003* (2013.01); *G09G 5/14* (2013.01); *H01L 27/3211* (2013.01); *H01L 51/524* (2013.01); *H01L 51/5262* (2013.01); *H04N 13/00* (2013.01); *G02F 2001/134345* (2013.01); *G09G 2320/028* (2013.01)

(56) References Cited

U.S. PATENT DOCUMENTS

| | | | | |
|---|---|---|---|---|
| 2015/0160465 A1* | 6/2015 | Fujino | .................... | G02B 27/26 349/12 |
| 2015/0185488 A1* | 7/2015 | Wu | ..................... | G02F 1/13306 349/15 |

FOREIGN PATENT DOCUMENTS

| | | |
|---|---|---|
| CN | 101576662 A | 11/2009 |
| CN | 103091896 A | 5/2013 |
| CN | 103135278 A | 6/2013 |
| CN | 103200411 A | 7/2013 |
| CN | 103235415 A | 8/2013 |
| CN | 203217237 U | 9/2013 |
| CN | 103345087 A | 10/2013 |
| CN | 103616767 A | 3/2014 |
| CN | 103700686 A | 4/2014 |
| CN | 104111538 A | 10/2014 |
| WO | 2005106563 A2 | 11/2005 |

\* cited by examiner

DISPLAY APPARATUS

TECHNICAL FIELD

Embodiments of the present disclosure relate to a display device.

BACKGROUND

Dual-view display devices have a main function of displaying different images at different angles so that through patterned blocking by means of a grating, an image displayed on pixels of odd rows or an image displayed on pixels of even rows is visible respectively for viewers from left side and viewers from right side. Therefore, viewers at different locations can see different images from different angles.

However, as known to the inventors, there has not been a display device which can achieve dual-view display and stereoscopic display at the same time in the art so far.

SUMMARY

One of the objects of the present disclosure is to provide a display device, in which display with dual-field of viewing can be performed and stereoscopic images are visible in both of the two fields of view.

To achieve the above object, at least one embodiment of the present disclosure provides a display device, comprising a first panel and a second panel disposed at a space from the first panel. The first panel comprises a plurality of first display groups, each of which comprises a plurality of rows of sub-pixels. The second panel is a transparent panel and comprises a plurality of second display groups, each of which comprises a plurality of rows of sub-pixels. The respective rows of sub-pixels in the plurality of first display groups correspond to the respective rows of sub-pixels in the plurality of second display groups one for one. The display device further comprises a multi-viewpoint grating which guides the light emitted from the plurality of rows of sub-pixels in respective first display groups in the first panel to the respective plurality of rows of sub-pixels in the second display groups on the second panel in a manner of one for one, so that a plurality of fields of view are formed on a light-emitting face of the second panel and a stereoscopic image is visible in each field of view. The number of fields of view is the same as the number of rows of sub-pixels in the first display group.

According to one embodiment of the present disclosure, the first display group comprises two rows of sub-pixels, and the multi-viewpoint grating is a dual-viewpoint grating.

According to one embodiment of the present disclosure, the multi-viewpoint grating is disposed between the first panel and the second panel, and the first panel, the second panel and the multi-viewpoint grating meet the requirement of the following formula:

$$a/h = b/(h'-h),$$

wherein a is a dimension of the sub-pixels of the first panel, b is a dimension of the sub-pixels of the second panel, h' is a depth of field of stereoscopic display of the display device, and h is a distance between the multi-viewpoint grating and the first panel.

According to one embodiment of the present disclosure, the first panel is a liquid crystal panel, and the display device further comprises a backlight source which is disposed at a light-incident side of the first panel.

According to one embodiment of the present disclosure, the first panel is an organic light-emitting diode panel.

According to one embodiment of the present disclosure, the first panel and the second panel are both liquid crystal panels, the display device further comprises a backlight source, and the multi-viewpoint grating is disposed between the backlight source and the first panel.

According to one embodiment of the present disclosure, the multi-viewpoint grating comprises a first substrate, a second substrate cell-assembled with the first substrate, a plurality of strip-like electrodes disposed on the first substrate with an interval therebetween, a plate-like electrode disposed on the second substrate, a liquid crystal layer filled between the first substrate and the second substrate, and a grating control circuit configured to supply signals respectively to the strip-like electrodes and the plate-like electrode.

According to one embodiment of the present disclosure, the strip-like electrodes and the plate-like electrode are both made of transparent conductive material.

According to one embodiment of the present disclosure, the display device comprises a plurality of input modules, the number of which corresponds to the plurality of fields of view one for one.

The display device provided by the embodiments of the present disclosure guides the light emitted from the respective sub-pixels of the first panel to the respective sub-pixels on the second panel which are corresponding to the respective sub-pixels of the first panel one for one by means of the multi-viewpoint grating, and thus can achieve not only multi-view display but also naked-eye stereoscopic display can be achieved and the requirement of users for multi-view display and stereoscopic display is met.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
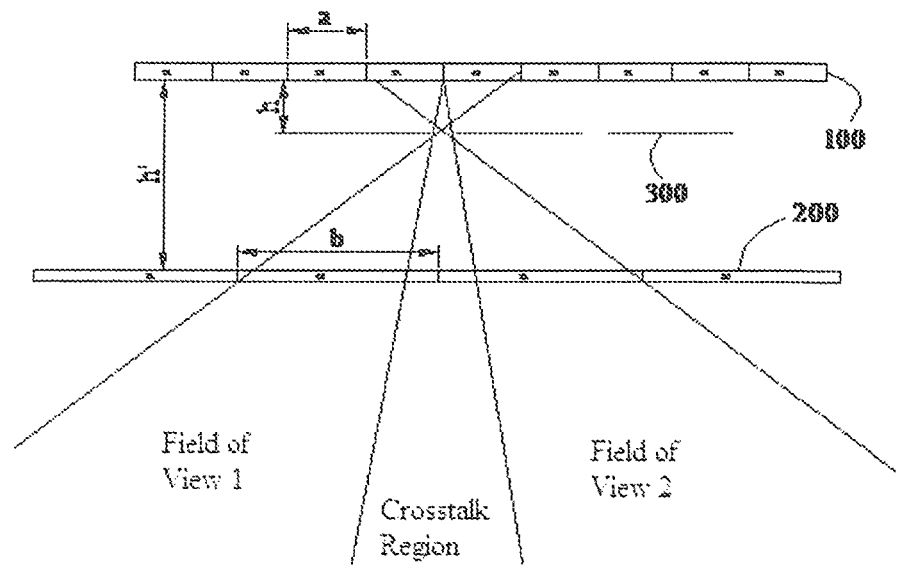
FIG. 1 is an illustrative view of a display device according to one embodiment of the present disclosure.
Figure 2:
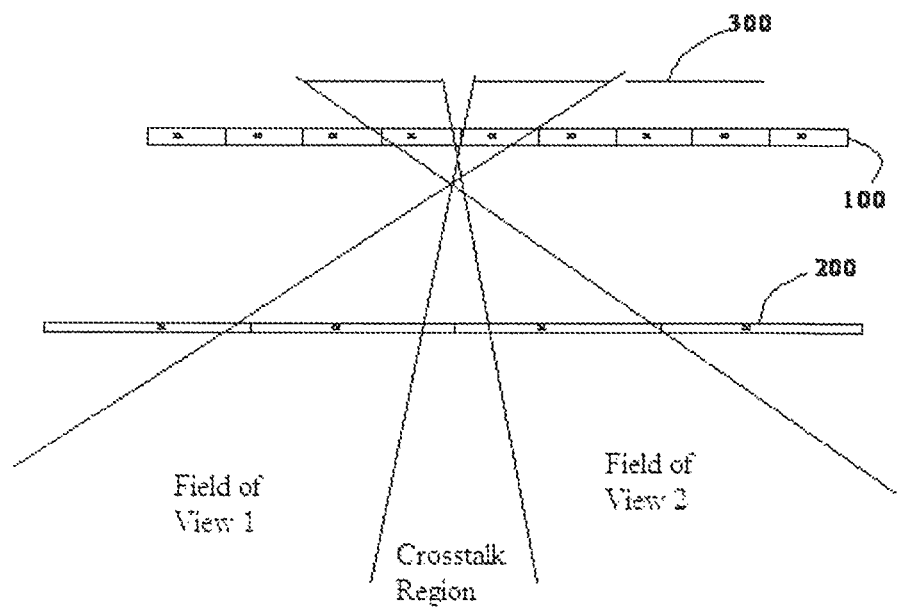
FIG. 2 is an illustrative view of a display device according to another embodiment of the present disclosure.

As illustrated in FIG. 1 and FIG. 2, one embodiment of the present disclosure provides a display device comprising a first panel 100 and a second panel 200 disposed at a distance from the first panel 100. The first panel 100 comprises a plurality of first display groups each of which comprises a plurality of rows of sub-pixels. The second panel 200 is a transparent panel and comprises a plurality of second display groups each of which comprises a plurality of rows of sub-pixels. The respective rows of sub-pixels in the first display groups correspond to the respective rows of sub-pixels in the second display groups one for one. The display device further comprises a multi-viewpoint grating 300 which is capable of guiding the light emitted from the plurality of rows of sub-pixels in each first display group in the first panel 100 to the respective plurality of rows of sub-pixels in the second display group on the second panel 200, so that a plurality of fields of view are formed on the light-emitting face of the second panel 200 and a stereoscopic image is visible in each field of view. The number of fields of view is the same as the number of rows of sub-pixels in the first display group.

In each of the first display groups of the first panel, each row of sub-pixels corresponds to one field of view. For example, each of the first display groups of the first panel comprises N rows of sub-pixels. Thus, in all of the first display groups, a first row of sub-pixels forms a complete image, a second row of sub-pixels forms a complete image, and so on. The image formed by the first row of sub-pixels can be different from the image formed by other rows of sub-pixels or can be the same as the latter.

In each of the second display groups of the second panel, each row of sub-pixels corresponds to one field of view. For example, each of the second display groups of the second panel comprises N rows of sub-pixels. Thus, in all of the second display groups, a first row of sub-pixels forms a complete image, a second row of sub-pixels forms a complete image, and so on. The image formed by the first row of sub-pixels can be different from the image formed by other rows of sub-pixels or can be the same as the latter. The image displayed by the first row of sub-pixels in the second display group of the second panel and the image displayed by the first row of sub-pixels in the first display group of the first panel match with each other, and so on.

Since the first panel 100 is disposed at the light-incident side of the second panel 200, the light emitted from the first panel 100 serves as a backlight source of the second panel 200. Therefore, the multi-viewpoint grating 300 is not only a multi-viewpoint grating of the first panel 100, but also a multi-viewpoint grating of the second panel 200. That is to say, the multi-viewpoint grating 300 can guide the light emitted from the respective rows of sub-pixels of the first panel 100 to the respective sub-pixels of the second panel 200 in a manner of one for one, and can guide the light emitted from the respective rows of sub-pixels of the second panel 200 to two different fields of view (Field of View 1 and Field of View 2 as illustrated in FIG. 1 and FIG. 2). The sub-pixels on the second panel 200 which receive the light have the same color as the sub-pixels on the first panel which emit the light. As illustrated in FIG. 1 and FIG. 2, red sub-pixels on the second panel 200 receive the light emitted from red sub-pixels on the first panel 100, green sub-pixels on the second panel 200 receive the light emitted from green sub-pixels on the first panel 100, and blue sub-pixels on the second panel receive the light emitted from blue sub-pixels on the first panel 100.

It can be readily appreciated that in the present disclosure, the first row of sub-pixels among a plurality of first image groups of the first panel 100 displays a type of image (called a first row image in the present disclosure), while the second row of sub-pixels among the plurality of first image groups of the first panel 100 displays another type of image (called a second row image in the present disclosure), and so on. The first row of sub-pixels among a plurality of second image groups of the second panel 200 displays an image matching with the first row image of the first panel 100, and the second row of sub-pixels among the plurality of second image groups of the second panel 200 displays an image matching with the second row image of the first panel 100.

Hereinafter, it is explained how the image on the first panel 100 "matches with" the image on the second panel 200 by taking an image on the first row of the first panel 100 as an example. Since the second panel 200 is transparent, in a field of view in front of the second panel 200, an image displayed by a first row of sub-pixels in the plurality of second image groups of the second panel 200 is visible, and an image on the first row displayed by the first panel 100 is visible through the second panel 200. The image displayed by the first row of sub-pixels in the plurality of second image groups of the second panel 200 and the image on the first row of the first panel 100 are arranged in a manner that one is behind the other, so that by fusion in the human brain, a visual effect of stereoscopic image can be generated. As long as the image on the first row of the first panel 100 and the image displayed on the first row of sub-pixels among a plurality of second image groups of the second panel 200 are fused in the human brain so that the human being can see an visual effect of stereoscopic image, it can be said that the image on the first row of the first panel 100 matches with the image displayed on the first row of sub-pixels in the plurality of second image groups of the second panel 200. Matching of the respective rows of sub-pixels are similar to the above and a detailed explanation is omitted here.

The display device according to the embodiments of the present disclosure guides the light emitted from the respective sub-pixels of the first panel 100 and the light emitted from the respective sub-pixels of the second panel 200 through the multi-viewpoint grating 300, which can achieve not only multi-view display but also naked-eye stereoscopic display and which meets the requirement of users for multi-view display and stereoscopic display.

In the present disclosure, the position at which the multi-viewpoint grating is disposed is not particularly limited, as long as it can guide the light in a manner as described above.

To observe an image with relatively high resolution in the respective fields of view, in one embodiment of the present disclosure, the display device can be dual-viewpoint display device and the multi-viewpoint grating 300 can be dual-viewpoint grating. That is to say, the first display group comprises two rows of sub-pixels and the second display group also comprises two rows of sub-pixels.

In one embodiment of the present disclosure, the multi-viewpoint grating 300 can guide the light emitted from the odd rows of sub-pixels of the first panel 100 to one of the odd rows of sub-pixels and the even rows of sub-pixels of the second panel 200, and guide the light emitted from the even rows of sub-pixels of the first panel 100 to the other of the odd rows of sub-pixels and the even rows of sub-pixels of the second panel 200. The sub-pixels on the second panel 200 which receive the light have the same color as the sub-pixels on the first panel 100 which emit the light, so that two fields of view (i.e., the Field of View 1 and the Field of View 2 illustrated in the drawings) are formed on the light-emitting face of the second panel 200 and a stereoscopic image can be observed in each field of view.

As the first embodiment of the present disclosure, as illustrated in FIG. 1, the multi-viewpoint grating 300 can be disposed between the first panel 100 and the second panel 200. The first panel 100, the second panel 200 and the multi-viewpoint grating 300 meet the requirement of the following equation:

$$a/h = b/(h'-h),$$

wherein a is a dimension of the sub-pixels of the first panel 100, b is a dimension of the sub-pixels of the second panel 200, h' is a depth of field of the stereoscopic display of the display device, and h is a distance between the multi-viewpoint grating 300 and the first panel 100.

In the present disclosure, the pitch of the multi-viewpoint grating 300 and the distance h between the multi-viewpoint grating 300 and the first panel 100 can be designed according to the design rule for the dual-view display, and the depth of field of the stereoscopic display of the display device can be designed according to conditions for achieving "a real stereoscopic display". All these are readily known by those skilled in the art and a detailed description is omitted here.

Here, the "dimension of the sub-pixels" refers to the width of the sub-pixels, i.e., the distance extended laterally by the sub-pixels.

In the present disclosure, the second panel 200 can be a liquid crystal panel, but there is no special requirement on the first panel 100. The first panel 100 can be an organic light-emitting diode (OLED) panel, or can be a liquid crystal panel. To obtain a relatively high resolution, the first panel 100 can be selected as an organic light-emitting diode panel. Alternatively, to save energy, the first panel can be selected as a liquid crystal panel. The operator can select the first panel as an organic light-emitting diode panel or a liquid crystal panel according to actual applications of the display device.

When the first panel is a liquid crystal panel, the display device further comprises a backlight source (not illustrated) which is disposed at the light-incident side of the first panel.

To save energy, the first panel 100 and the second panel 200 can be both provided as liquid crystal panels. As a second embodiment of the present disclosure, as illustrated in FIG. 2, the first panel 100 and the second panel 200 are both liquid crystal panels. The display device further comprises a backlight source (not illustrated). The multi-viewpoint grating 300 is disposed between the backlight source and the first panel 100.

When the same display device is used by two users, one user views it in the Field of View 1, while the other user views it in the Field of View 2. The two users can view different stereoscopic images.

In the present disclosure, the structure of the multi-viewpoint grating 300 is not limited. For example, the multi-viewpoint grating 300 can be a slit grating or a lens grating.

As one embodiment of the present disclosure, the multi-viewpoint grating 300 can be a liquid crystal grating. For example, the multi-viewpoint grating 300 comprises a first substrate, a plurality of strip-like electrodes disposed on the first substrate with an interval therebetween, a second substrate cell-assembled with the first substrate, a plate-like electrode disposed on the second substrate, a liquid crystal layer filled between the first substrate and the second substrate, and a grating control circuit configured to supply a first signal to the strip-like electrodes and to supply a second signal to the plate-like electrode.

When the grating control circuit supplies a first signal and a second signal to the strip-like electrodes and the plate-like electrode respectively, the liquid crystalline molecules between the strip-like electrodes and the plate-like electrode are deflected so that light cannot pass through the portions corresponding to the strip-like electrodes but can only pass through the portions between adjacent two strip-like electrodes, thereby forming a plurality of fields of view at the light-emitting side of the second panel.

To make the display device capable of being switched between multi-field of view and a single field of view, in one embodiment, the strip-like electrodes and the plate-like electrode are both made of transparent conductive material. When the grating control circuit supplies no first signal and no second signal to the strip-like electrodes and the plate-like electrode, the liquid crystalline molecules are not deflected and light can pass through the liquid crystalline molecules, so that a single field of view is formed at the light-emitting side of the second panel.

When the display device is in a mode of multi-field of view, a plurality of viewers are able to watch the desired contents in different fields of view. When the display device is in a mode of single field of view, viewers can observe an image with relatively high resolution at the light-emitting side of the second panel. Viewers can make their choices to set the display device either in a mode of multi-field of view or in a mode of single field of view as required.

In one embodiment, the display device comprises a plurality of input modules, the number of which corresponds to the plurality of fields of view one for one. Viewers in different fields of view can operate on the display interface within the field of view by using a corresponding input module.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201410323544.1 filed on Jul. 8, 2014, the disclosure of which is hereby entirely incorporated by reference as a part of the present disclosure.

The invention claimed is:

1. A display device, comprising a first panel and a second panel disposed at a distance from the first panel, wherein the first panel comprises a plurality of first display groups each of which comprises a plurality of rows of sub-pixels, the second panel is a transparent panel and comprises a plurality of second display groups each of which comprises a plurality of rows of sub-pixels, the respective rows of sub-pixels in the first display groups correspond to the respective rows of sub-pixels in the second display groups one for one; the display device further comprising a multi-viewpoint grating which is capable of guiding the light emitted from respective rows of the sub-pixels in the plurality of first display groups in the first panel to respective rows of the sub-pixels in the plurality of second display groups in the second panel in a manner of one for one, so that a plurality of fields of view are formed at a light-emitting side of the second panel and a stereoscopic image is visible in each field of view, wherein the number of fields of view is the same as the number of rows of sub-pixels in the first display group.

2. The display device according to claim 1, wherein the first display group comprises two rows of sub-pixels, and the multi-viewpoint grating is a dual-viewpoint grating.

3. The display device according to claim 1, wherein the multi-viewpoint grating is disposed between the first panel and the second panel, and the first panel, the second panel and the multi-viewpoint grating meet the requirement of the following equation:

$$a/h=b/(h'-h),$$

wherein a is a dimension of the sub-pixels of the first panel extending laterally, b is a dimension of the sub-pixels of the second panel extending laterally, h' is a depth of field of stereoscopic display of the display device, and h is a distance between the multi-viewpoint grating and the first panel.

4. The display device according to claim 1, wherein the first panel is a liquid crystal panel, and the display device further comprises a backlight source which is disposed at a light-incident side of the first panel.

5. The display device according to claim 1, wherein the first panel is an organic light-emitting diode panel.

6. The display device according to claim 1, wherein the first panel and the second panel are both liquid crystal panels, the display device further comprises a backlight source, and the multi-viewpoint grating is disposed between the backlight source and the first panel.

7. The display device according to claim 1, wherein the multi-viewpoint grating comprises a first substrate on which a plurality of strip-like electrodes are disposed with an interval therebetween, a second substrate cell-assembled with the first substrate, on which a plate-like electrode is disposed, a liquid crystal layer filled between the first substrate and the second substrate, and a grating control circuit configured to supply signals respectively to the plurality of strip-like electrodes and the plate-like electrode, the plurality of strip-like electrodes being disposed with an interval.

8. The display device according to claim 7, wherein the plurality of strip-like electrodes and the plate-like electrode are both made of transparent conductive material.

9. The display device according to claim 1, wherein the display device comprises a plurality of input modules, the number of which is identical to the number of the fields of view.

10. The display device according to claim 2, wherein the multi-viewpoint grating is disposed between the first panel and the second panel, and the first panel, the second panel and the multi-viewpoint grating meet the requirement of the following equation:

$$a/h = b/(h'-h),$$

wherein a is a dimension of the sub-pixels of the first panel extending laterally, b is a dimension of the sub-pixels of the second panel extending laterally, h' is a depth of field of stereoscopic display of the display device, and h is a distance between the multi-viewpoint grating and the first panel.

11. The display device according to claim 2, wherein the first panel is a liquid crystal panel, and the display device further comprises a backlight source which is disposed at a light-incident side of the first panel.

12. The display device according to claim 3, wherein the first panel is a liquid crystal panel, and the display device further comprises a backlight source which is disposed at a light-incident side of the first panel.

13. The display device according to claim 2, wherein the first panel and the second panel are both liquid crystal panels, the display device further comprises a backlight source, and the multi-viewpoint grating is disposed between the backlight source and the first panel.

14. The display device according to claim 3, wherein the first panel and the second panel are both liquid crystal panels, the display device further comprises a backlight source, and the multi-viewpoint grating is disposed between the backlight source and the first panel.

15. The display device according to claim 2, wherein the multi-viewpoint grating comprises a first substrate on which a plurality of strip-like electrodes are disposed with an interval therebetween, a second substrate cell-assembled with the first substrate, on which a plate-like electrode is disposed, a liquid crystal layer filled between the first substrate and the second substrate, and a grating control circuit configured to supply signals respectively to the plurality of strip-like electrodes and the plate-like electrode, the plurality of strip-like electrodes being disposed with an interval.

16. The display device according to claim 3, wherein the multi-viewpoint grating comprises a first substrate on which a plurality of strip-like electrodes are disposed with an interval therebetween, a second substrate cell-assembled with the first substrate, on which a plate-like electrode is disposed, a liquid crystal layer filled between the first substrate and the second substrate, and a grating control circuit configured to supply signals respectively to the plurality of strip-like electrodes and the plate-like electrode, the plurality of strip-like electrodes being disposed with an interval.

17. The display device according to claim 4, wherein the multi-viewpoint grating comprises a first substrate on which a plurality of strip-like electrodes are disposed with an interval therebetween, a second substrate cell-assembled with the first substrate, on which a plate-like electrode is disposed, a liquid crystal layer filled between the first substrate and the second substrate, and a grating control circuit configured to supply signals respectively to the plurality of strip-like electrodes and the plate-like electrode, the plurality of strip-like electrodes being disposed with an interval.

18. The display device according to claim 2, wherein the display device comprises a plurality of input modules, the number of which is identical to the number of the fields of view.

19. The display device according to claim 3, wherein the display device comprises a plurality of input modules, the number of which is identical to the number of the fields of view.

20. The display device according to claim 4, wherein the display device comprises a plurality of input modules, the number of which is identical to the number of the fields of view.

* * * * *